(12) United States Patent
Tan et al.

(10) Patent No.: US 10,923,931 B2
(45) Date of Patent: Feb. 16, 2021

(54) INFORMATION HANDLING SYSTEM WITH SENSOR ACTIVATED BATTERY CHARGE LEVEL INDICATOR

(71) Applicant: DELL PRODUCTS, LP, Round Rock, TX (US)

(72) Inventors: Geroncio O. Tan, Austin, TX (US); Danilo O. Tan, Austin, TX (US); Timothy C. Shaw, Austin, TX (US); James T. Gillon, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 153 days.

(21) Appl. No.: 15/983,018

(22) Filed: May 17, 2018

(65) Prior Publication Data

US 2019/0356148 A1    Nov. 21, 2019

(51) Int. Cl.
*H02J 7/00* (2006.01)
*H02J 7/14* (2006.01)
*G06F 3/01* (2006.01)
*G01R 31/36* (2020.01)

(52) U.S. Cl.
CPC ........ *H02J 7/0047* (2013.01); *G01R 31/3646* (2019.01); *G06F 3/017* (2013.01); *H02J 7/0048* (2020.01)

(58) Field of Classification Search
USPC ........................................................ 320/132
See application file for complete search history.

(56) References Cited

U.S. PATENT DOCUMENTS

| 9,881,465 | B2 | 1/2018 | Kuscher et al. | |
| 2011/0127953 | A1* | 6/2011 | Walley | G06K 19/0723 320/108 |
| 2012/0001591 | A1* | 1/2012 | Fukaya | H02J 50/12 320/108 |
| 2016/0012686 | A1* | 1/2016 | Kuscher | G10L 15/22 704/251 |
| 2017/0012461 | A1* | 1/2017 | Hayashi | H02J 7/025 |
| 2017/0346323 | A1* | 11/2017 | MacLaughlin | H02J 7/00 |
| 2018/0065544 | A1 | 3/2018 | Brusco | |
| 2018/0096754 | A1* | 4/2018 | Song | H01B 11/002 |
| 2018/0299929 | A1* | 10/2018 | Kim | G06F 1/1635 |
| 2019/0250684 | A1* | 8/2019 | Badenes | G06F 1/28 |

* cited by examiner

*Primary Examiner* — Alexis B Pacheco
(74) *Attorney, Agent, or Firm* — Larson Newman, LLP

(57) ABSTRACT

An information handling system includes an motion sensor, an embedded controller, and a battery charge indicator. The motion sensor detects a battery charge request, and provides a trigger signal in response to the battery charge request being detected. The embedded controller receives the trigger signal from the motion sensor, and requests a relative state of charge of a battery in response to the trigger signal. The embedded controller then receives the relative state of charge of the battery, and provides a relative state of charge indication signal. The battery charge indicator receives the relative state of charge indication signal, and outputs an indication of the relative state of charge of the battery based on relative state of charge indication signal.

11 Claims, 5 Drawing Sheets

INFORMATION HANDLING SYSTEM WITH SENSOR ACTIVATED BATTERY CHARGE LEVEL INDICATOR

FIELD OF THE DISCLOSURE

The present disclosure generally relates to information handling systems, and more particularly relates to an information handling system with sensor activated battery charge level indicator.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes an accelerometer, an embedded controller, and a battery charge indicator. The accelerometer may detect a battery charge request, and provides a trigger signal in response to the battery charge request being detected. The embedded controller may receive the trigger signal from the accelerometer, and may request a relative state of charge of a battery in response to the trigger signal from a battery management unit (BMU). The embedded controller may then receive the relative state of charge of the battery, and may provide a relative state of charge indication signal. The battery charge indicator may receive the relative state of charge indication signal, and may output an indication of the relative state of charge of the battery based on relative state of charge indication signal.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
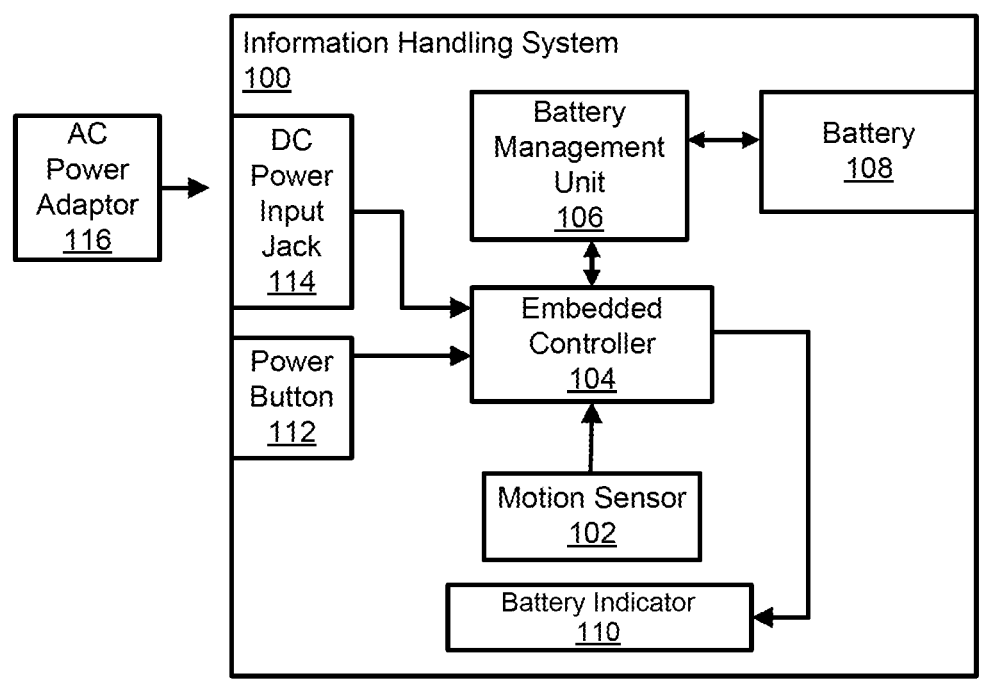
FIG. 1 is a block diagram of a portion of an information handling system according to at least one embodiment of the disclosure.

FIG. 1 shows a portion of an information handling system 100 that includes an motion sensor 102, an embedded controller 104, a battery management unit 106, a battery 108, a battery charge indicator 110, a power button 112, and a direct current (DC) power input jack 114. In an embodiment, the motion sensor 102 can be any type of sensor that is capable of measuring motion of the information handling system in the X, Y, and Z directions, such as an accelerometer. In an embodiment, the battery charge indicator 110 can include multiple illumination components, such as multiple light emitting diodes (LEDs) representing the level of charge, multiple micro holes with rear backlighting, or the like. In an embodiment, the battery charge 110 indicator can be located on any surface or edge, such as a front edge, of the information handling system 100. Similar solutions comprise of information handling systems with a capacitive sensor triggered battery charge level indicator, are prone to false triggers that could cause the information handling system to read a battery charge level when not wanted by a user. The unwanted battery charge reads can cause unnecessary power usage of the battery, which in turn can reduce the overall charge of the battery. Therefore, an improved battery charge monitoring system with reduced power usage is described herein.

If the motion sensor 102 has never been powered on before or if the battery 108 has been completely drained, the motion sensor 102 may not have the firmware installed to monitor for a battery charge level request. In these situations, if the power button 112 is pressed or an AC power adaptor 116 is inserted into the DC power input jack 114, a wake up signal can be sent to the embedded controller 104. In an embodiment, the pressing of the power button 112 when the motion sensor 102 has never been powered on before. In an embodiment, the detection of the AC power adaptor 116 being inserted into the DC power input jack 114 can be performed only if the battery 108 has completely died.

After wake up, the embedded controller 104 can initialized the motion sensor 102 to detect battery charge level requests. In an embodiment, the initialization of the motion sensor 102 can include loading firmware into the motion sensor 102 to cause the motion sensor 102 only detect or measure movements. To minimize false detections, only one direction, such as the Y direction (direction parallel to the tap force) is enabled. The firmware of the motion sensor 102 can also cause the motion sensor 102 to be able to distinguish between proper requests and other movements of the information handling system 100. For example, the motion sensor 102 can measure a time domain waveform of detected movements, and can utilize a Fast Fourier Transform (FFT) conversion of the time domain waveform to verify that the movement was a proper request, such as double tap on the front of the information handling system 100, and not an individual carrying the information handling system 100 while walking, going up and down the stairs, riding a bike or auto on bumpy road, light drop the system on the desk, or any other type of movement of the information handling system 100. One of ordinary skill in the art would recognize that the double tap input can be replaced with other types inputs measured by the sensor, as long as the other types of inputs can be distinguished from random shakes or other movements of the information handling system, without varying from the scope of this disclosure.

Once initialized, the motion sensor 102 can monitor for battery charge level requests, such as a pre-defined pattern. In an embodiment, the pre-defined pattern can be a double tap, a gesture, or the like. In an embodiment, the motion sensor 102 can determine whether the taps of the double tap occur within a given interval of time. In an embodiment, the threshold time interval can be a default time interval when the information handling system 100 experiences a first boot, but can be changed by an administrator, if desired. The power consumption of the motion sensor 102 is extremely low so no significant impact to standby battery life is caused by the motion sensor 102 always remaining on even if the rest of the information handling system 100 is powered down.

When a double tap or other pre-defined taps or gestures input is detected, the motion sensor 102 can provide a signal to the embedded controller 104, such as a trigger signal. The signal can cause the embedded controller 104 to wake-up if the embedded controller 104 was powered down. The signal can also cause the embedded controller 104 to request a relative state of charge (RSOC) of the battery 108 from the battery management unit 106. The battery management unit 106 can receive the RSOC request from the embedded controller and can read the RSOC of the battery 108. The battery management unit 106 can then return the RSOC of the battery 108 to the embedded controller 104, which in turn can cause the battery indicator 110 to provide a visual indication of the RSOC of the battery 108. In an embodiment, a different number of illumination components within the battery charge indicator 110 are illuminated based on the RSOC of the battery 108. For example, the higher the RSOC of the battery 108 the greater number of illumination components within the battery charge indicator 110 that are illuminated or displayed. The embedded controller 104 can then determine whether a timer for the battery charge indicator 110 has expired. When the timer has expired, embedded controller 104 can turn off the battery charge indicator 110. Thus, the motion sensor 102 can monitor for and detect a battery charge request during any power state of other components of the information handling system 100, such as powered on or powered off, and can ensure that only proper requests cause the RSOC of the battery 108 to be read and displayed so that standby power loss can be reduced.

Figure 2:
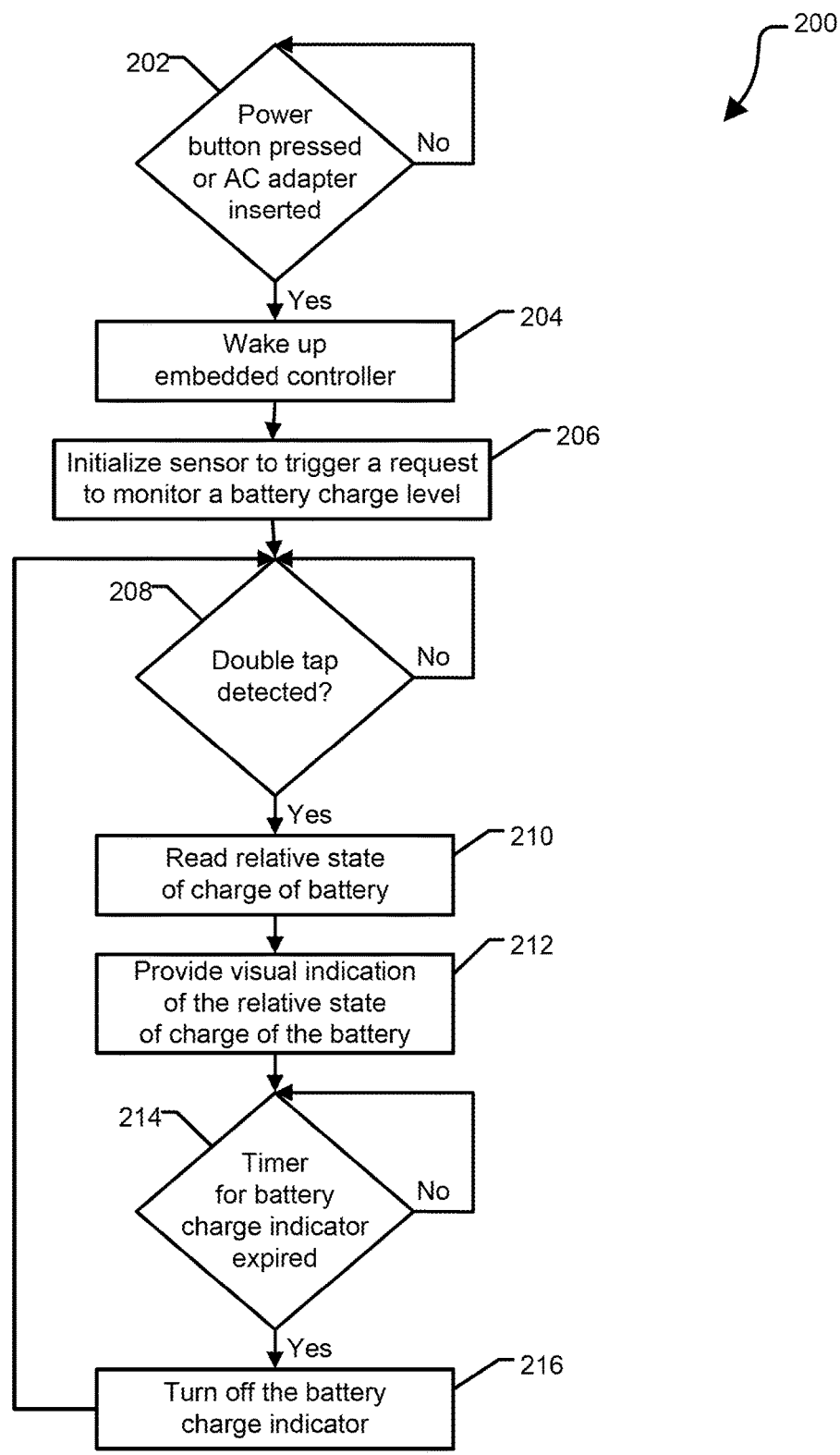
FIG. 2 is a flow diagram of a method for providing a battery charge level indication when a sensor of the information handling system experiences a first time boot according to at least one embodiment of the present disclosure.

FIG. 2 is a flow diagram of a method 200 for providing a battery charge level indication when a sensor of the information handling system experiences a first time boot according to at least one embodiment of the present disclosure. At block 202, a determination is made whether a power button of the information handling system is pressed or an alternating current (AC) adapter is inserted within the information handling system. In an embodiment, the pressing of the power button can be detected only in situations where the information handling system has never been powered on before, such that the information handling system is experiencing a first boot. When the power button of the information handling system is pressed or the AC adapter is inserted within the information handling system, an embedded controller of the information handling system wakes up at block 204.

At block 206, a sensor used to trigger an embedded controller to query a battery relative state of charge (RSOC) is initialized. In an embodiment, the sensor is initialized only if the embedded controller determines that the sensor's firmware is out of date. In an embodiment, the sensor can be any motion sensor, such as an accelerometer, that is capable of measuring motion of the information handling system in the X, Y, and Z directions. In an embodiment, the initialization of the sensor can be to cause the sensor only detect or measure movements in one direction, such as in a direction parallel to a tap force so that the chances of a false trigger are reduced. At block 208, a determination is made whether a double tap of the sensor has been detected. In an embodiment, the sensor can determine whether the double tap detected is a proper request for checking the battery charge level. In an embodiment, a proper request is a double tap on the front edge of the information handling system with a time interval between the taps being below of threshold interval. One of ordinary skill in the art would recognize that the double tap input can be replaced with other types inputs measured by the sensor, as long as the other types of inputs can be distinguished from random shakes or other movements of the information handling system, without varying from the scope of this disclosure. In an embodiment, the threshold time interval can be a default time interval when the information handling system experiences a first boot, but can be changed by an administrator, if desired. The sensor can measure a time domain waveform of detected movement, and can utilize a Fast Fourier Transform (FFT) conversion of the time domain waveform to verify that the movement was a double tap on the front of the information handling system and not an individual carrying the information handling system while walking, or any other type of movement.

When a double tap input is detected, a relative state of charge (RSOC) of the battery is read at block 210. In an embodiment, the RSOC can be read by the embedded controller via a battery management unit of the information handling system. At block 212, a visual indication of the RSOC is provided via a battery charge indicator. In an embodiment, the battery charge indicator can include multiple illumination components, such as multiple light emitting diodes (LEDs), multiple micro holes with rear lighting, or the like. In an embodiment, the battery charge indicator can be located on one of the edges, such as a front edge, of the information handling system. In an embodiment, a different number of the illumination components within the battery charge indicator are illuminated based on the RSOC of the battery. For example, the higher the RSOC of the battery the greater number of illumination components that are illuminated. At block 214, a determination is made whether a timer for the battery charge indicator has expired. When the timer has expired, the battery charge indicator is turned off at block 216, and the flow continues as stated above at block 208.

Figure 3:
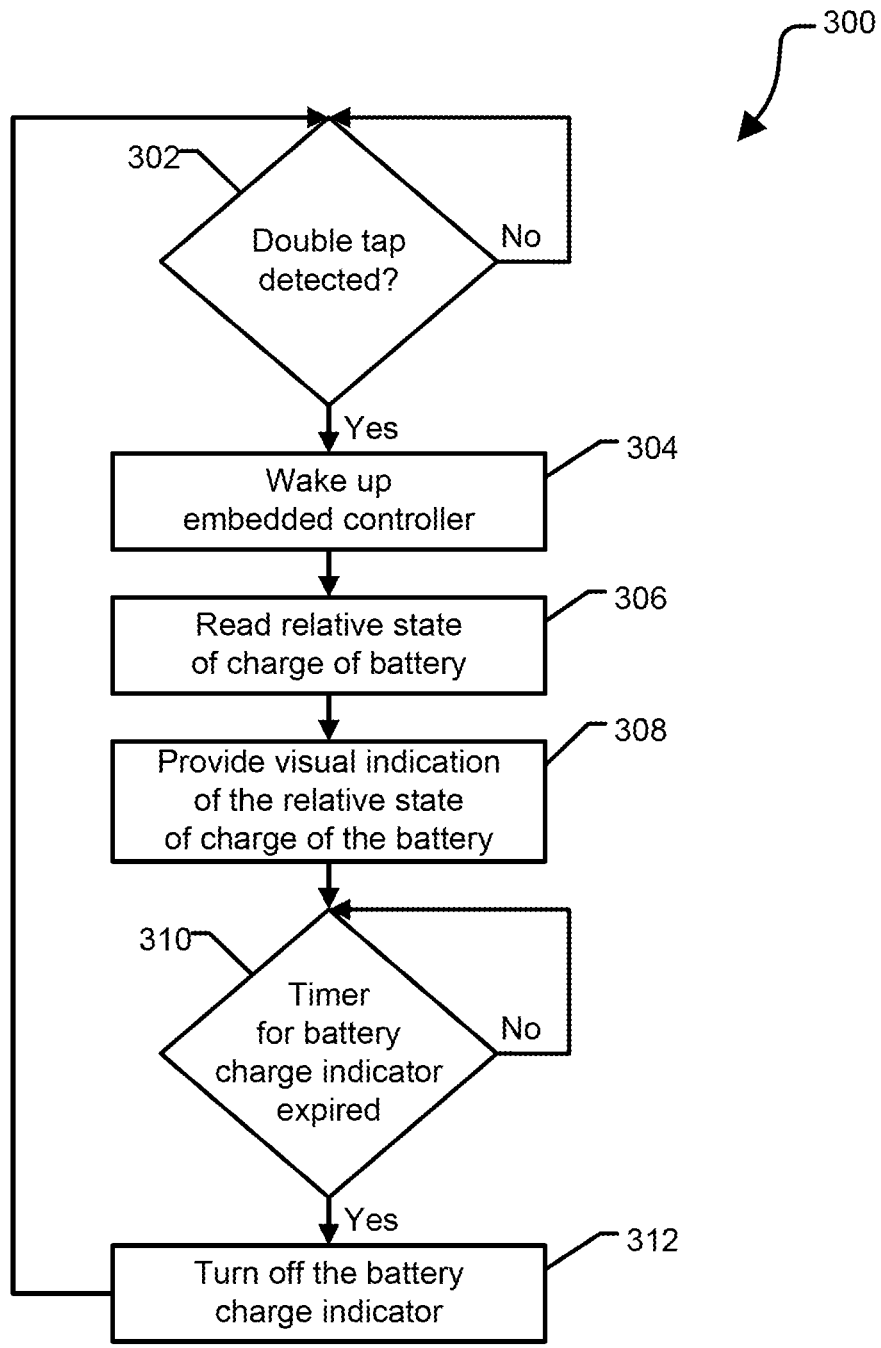
FIG. 3 is a flow diagram of a method for providing a battery charge level indication when the information handling system is powered off but the sensor remains powered according to at least one embodiment of the present disclosure.

FIG. 3 is a flow diagram of a method 300 for providing a battery charge level indication when the information handling system is powered off but the sensor remains powered on with the firmware up-to-date according to at least one embodiment of the present disclosure. At block 302, a determination is made whether a double tap of a sensor has been detected. In an embodiment, the sensor can be an accelerometer that is capable of measuring motion of the information handling system in the X, Y, and Z directions. In an embodiment, the sensor can determine whether the double tap detected is a proper request for checking the battery charge level. In an embodiment, a proper request is a double tap on the front edge of the information handling system with a time interval between the taps being below of threshold interval. When the double tap input is detected, an embedded controller of the information handling system wakes up at block 304.

At block 306, a RSOC of the battery is read. In an embodiment, the RSOC can be read by the embedded controller via a battery management unit of the information handling system. A visual indication of the RSOC is provided via a battery charge indicator at block 308. At block 310, a determination is made whether a timer for the battery charge indicator has expired. When the timer has expired, the battery charge indicator is turned off at block 312, and the flow continues as stated above at block 302.

Figure 4:
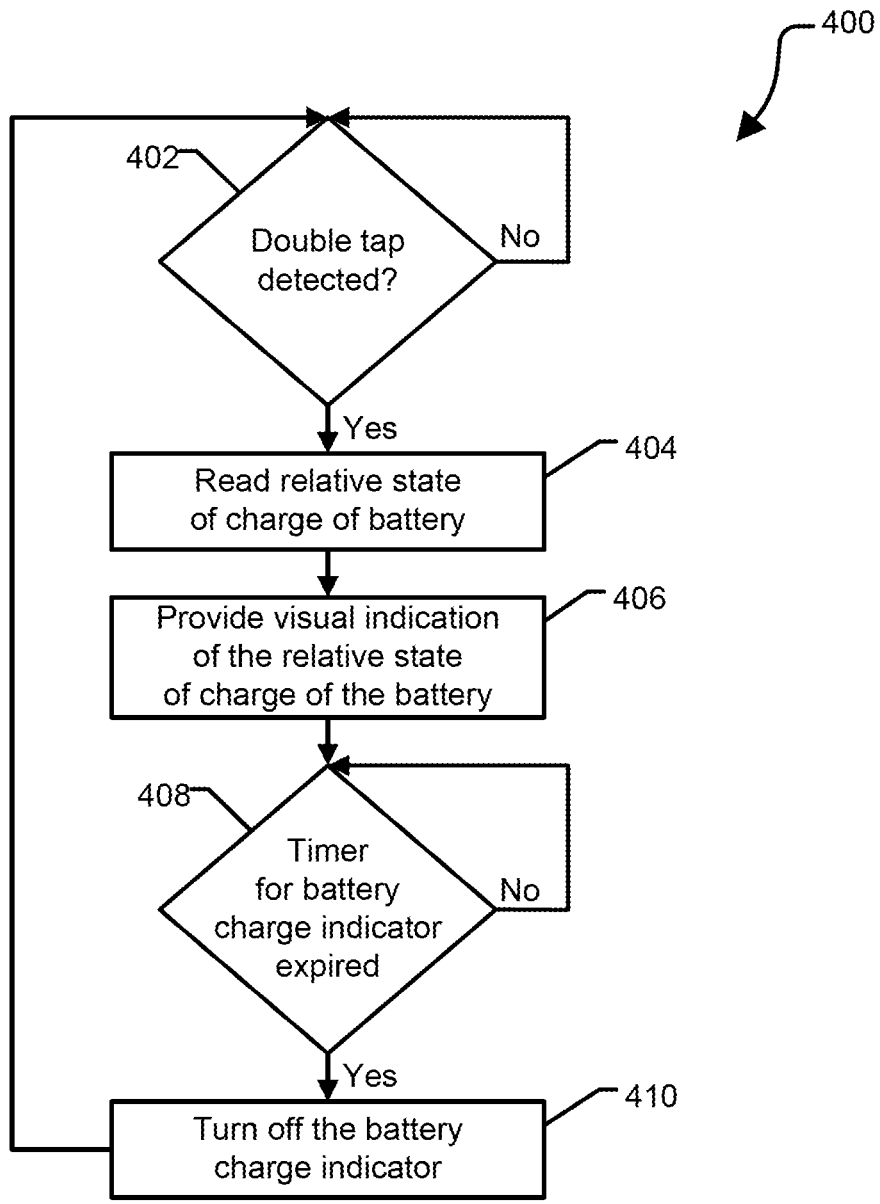
FIG. 4 is a flow diagram of a method for providing a battery charge level indication when the information handling system powered on according to at least one embodiment of the present disclosure.

FIG. 4 is a flow diagram of a method 400 for providing a battery charge level indication when the information handling system powered on according to at least one embodiment of the present disclosure. At block 402, a determination is made whether a double tap of a sensor has been detected. In an embodiment, the sensor can be an accelerometer that is capable of measuring motion of the information handling system in the X, Y, and Z directions. In an embodiment, the initialization of the sensor can be to cause the sensor only detect or measure movements in one direction, such as the Y direction. In an embodiment, the sensor can determine whether the double tap detected is a proper request for checking the battery charge level. In an embodiment, a proper request is a double tap on the front edge of the information handling system with a time interval between the taps being below of threshold interval.

When the double tap input is detected, a RSOC of the battery is read at block 404. In an embodiment, the RSOC can be read by the embedded controller via a battery management unit of the information handling system. A visual indication of the RSOC is provided via a battery charge indicator at block 406. At block 408, a determination is made whether a timer for the battery charge indicator has expired. When the timer has expired, the battery charge indicator is turned off at block 410, and the flow continues as stated above at block 402.

Figure 5:
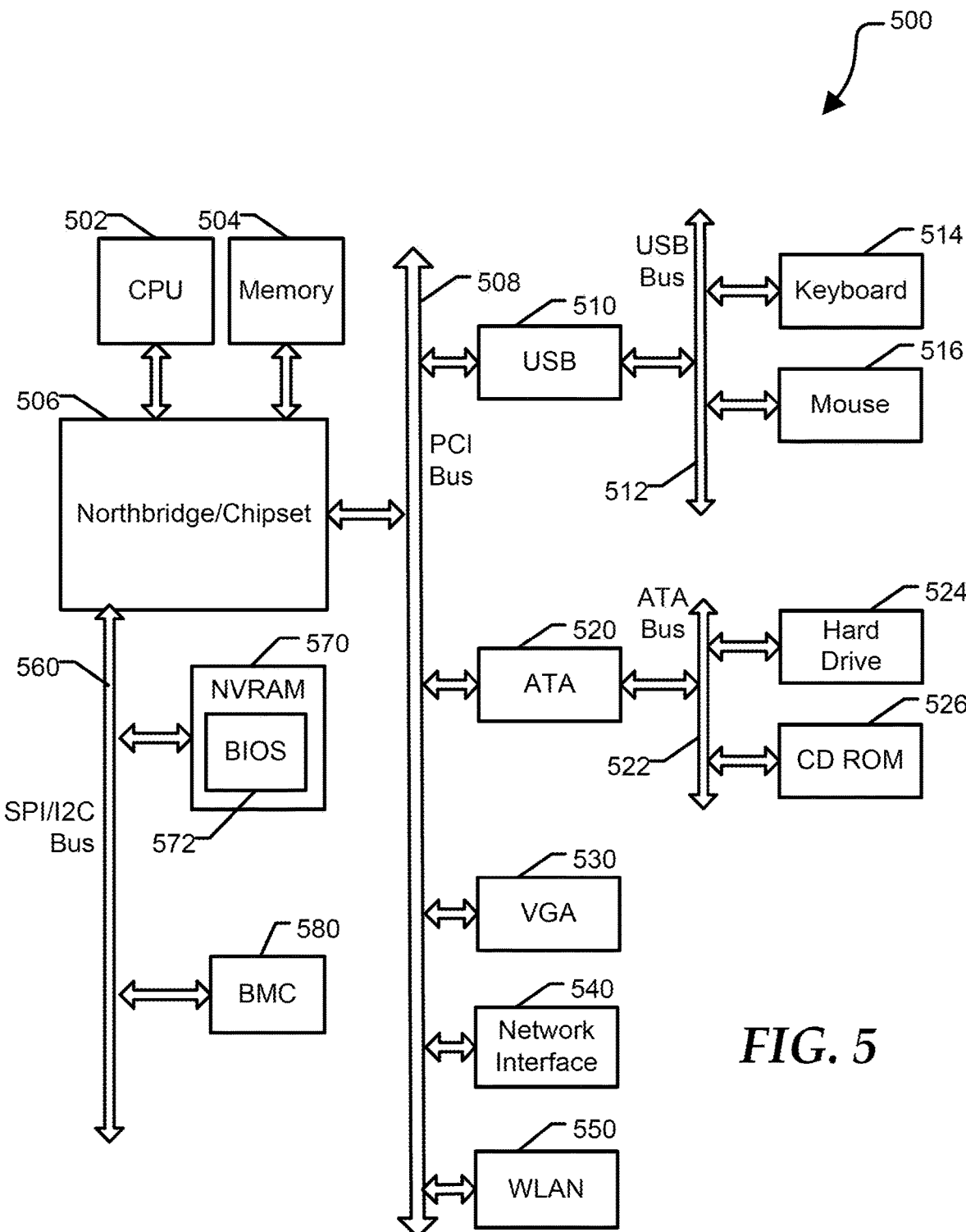
FIG. 5 is a block diagram of a general information handling system according to an embodiment of the present disclosure.

FIG. 5 illustrates a general information handling system 500 including a processor 502, a memory 504, a northbridge/chipset 506, a PCI bus 508, a universal serial bus (USB) controller 510, a USB 512, a keyboard device controller 514, a mouse device controller 516, a configuration an ATA bus controller 520, an ATA bus 522, a hard drive device controller 524, a compact disk read only memory (CD ROM) device controller 526, a video graphics array (VGA) device controller 530, a network interface controller (NIC) 540, a wireless local area network (WLAN) controller 550, a serial peripheral interface (SPI) bus 560, a NVRAM 570 for storing BIOS 572, and a baseboard management controller (BMC) 580. BMC 580 can be referred to as a service processor or embedded controller (EC). Capabilities and functions provided by BMC 580 can vary considerably based on the type of information handling system. For example, the term baseboard management system is often used to describe an embedded processor included at a server, while an embedded controller is more likely to be found in a consumer-level device. As disclosed herein, BMC 580 represents a processing device different from CPU 502, which provides various management functions for information handling system 500. For example, an embedded controller may be responsible for power management, cooling management, and the like. An embedded controller included at a data storage system can be referred to as a storage enclosure processor.

For purpose of this disclosure information handling system 500 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 500 can include processing resources for executing machine-executable code, such as CPU 502, a programmable logic array (PLA), an embedded device such as a System-on-a-Chip (SoC), or other control logic hardware. Information handling system 500 can also include one or more computer-readable medium for storing machine-executable code, such as software or data.

System 500 can include additional processors that are configured to provide localized or specific control functions, such as a battery management controller. Bus 560 can include one or more busses, including a SPI bus, an I2C bus, a system management bus (SMBUS), a power management bus (PMBUS), and the like. BMC 580 can be configured to provide out-of-band access to devices at information handling system 500. As used herein, out-of-band access herein refers to operations performed prior to execution of BIOS 572 by processor 502 to initialize operation of system 500.

BIOS 572 can be referred to as a firmware image, and the term BIOS is herein used interchangeably with the term firmware image, or simply firmware. BIOS 572 includes instructions executable by CPU 502 to initialize and test the hardware components of system 500, and to load a boot loader or an operating system (OS) from a mass storage device. BIOS 572 additionally provides an abstraction layer for the hardware, such as a consistent way for application programs and operating systems to interact with the keyboard, display, and other input/output devices. When power is first applied to information handling system 500, the system begins a sequence of initialization procedures. During the initialization sequence, also referred to as a boot sequence, components of system 500 are configured and enabled for operation, and device drivers can be installed.

Device drivers provide an interface through which other components of the system 500 can communicate with a corresponding device.

Information handling system 500 can include additional components and additional busses, not shown for clarity. For example, system 500 can include multiple processor cores, audio devices, and the like. While a particular arrangement of bus technologies and interconnections is illustrated for the purpose of example, one of skill will appreciate that the techniques disclosed herein are applicable to other system architectures. System 500 can include multiple CPUs and redundant bus controllers. One or more components can be integrated together. For example, portions of northbridge/chipset 506 can be integrated within CPU 502. Additional components of information handling system 500 can include one or more storage devices that can store machine-executable code, one or more communications ports for communicating with external devices, and various input and output (I/O) devices, such as a keyboard, a mouse, and a video display. An example of information handling system 500 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 500 can include a set of instructions that can be executed to cause the information handling system to perform any one or more of the methods or computer based functions disclosed herein. The information handling system 500 may operate as a standalone device or may be connected to other computer systems or peripheral devices, such as by a network.

In a networked deployment, the information handling system 500 may operate in the capacity of a server or as a client user computer in a server-client user network environment, or as a peer computer system in a peer-to-peer (or distributed) network environment. The information handling system 500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 500 can be implemented using electronic devices that provide voice, video or data communication. Further, while a single information handling system 500 is illustrated, the term "system" shall also be taken to include any collection of systems or sub-systems that individually or jointly execute a set, or multiple sets, of instructions to perform one or more computer functions.

The information handling system 500 can include a disk drive unit and may include a computer-readable medium, not shown in FIG. 5, in which one or more sets of instructions, such as software, can be embedded. Further, the instructions may embody one or more of the methods or logic as described herein. In a particular embodiment, the instructions may reside completely, or at least partially, within system memory 504 or another memory included at system 500, and/or within the processor 502 during execution by the information handling system 500. The system memory 504 and the processor 502 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a motion sensor to detect a predefined motion pattern, and to provide a trigger signal as a battery charge request in response to predefined motion pattern being detected;
   an embedded controller to communicate with the motion sensor, the embedded controller to receive the trigger signal from the motion sensor, to request a relative state of charge of a battery in response to the trigger signal, to receive the relative state of charge of the battery, and to provide a relative state of charge indication signal;
   a battery charge indicator to communicate with the embedded controller, the battery charge indicator to receive the relative state of charge indication signal, and to output an indication of the relative state of charge of the battery based on relative state of charge indication signal; and
   a battery management unit to communicate with the embedded controller, the battery management unit to receive the request for the relative state of charge of the battery from the embedded controller, to read the relative state of charge of the battery, and to provide the relative state of charge of the battery to the embedded controller.

2. The information handling system of claim 1, wherein the predefined motion is a double tap movement of the information handling system in a single direction.

3. The information handling system of claim 2, the motion sensor further to detect that taps of the double tap movement occur within a specific interval of time.

4. The information handling system of claim 2, the motion sensor further to measure a time domain waveform of detected movement of the information handling system, and to perform a Fast Fourier Transform conversion of the time domain waveform to verify that a movement is the double tap movement.

5. The information handling system of claim 1, wherein the motion sensor remains powered on while remaining components of the information handling system are powered off.

6. The information handling system of claim 1, wherein if the embedded controller is powered off, the embedded controller wakes up in response to the relative state of charge request being received.

7. An information handling system comprising:
   a motion sensor to detect a predefined motion pattern, and to provide a trigger signal as a battery charge request in response to predefined motion pattern being detected;
   an embedded controller to communicate with the motion sensor, the embedded controller to receive the trigger signal from the motion sensor, to request a relative state of charge of a battery in response to the trigger signal, to receive the relative state of charge of the battery, and to provide a relative state of charge indication signal;
   a battery charge indicator to communicate with the embedded controller, the battery charge indicator including a plurality of micro holes with a rear backlighting, the battery charge indicator to receive the relative state of charge indication signal, and to illuminate a different number of the micro holes to output an indication of the relative state of charge of the battery based on relative state of charge indication signal, wherein a number of the micro holes illuminated increases at higher states of the relative state of charge of the battery; and
   a battery management unit to communicate with the embedded controller, the battery management unit to receive the request for the relative state of charge of the battery from the embedded controller, to read the relative state of charge of the battery, and to provide the relative state of charge of the battery to the embedded controller.

8. The information handling system of claim 7, wherein the predefined motion is a double tap movement of the information handling system in a single direction.

9. The information handling system of claim 8, the motion sensor further to detect that taps of the double tap movement occur within a specific interval of time.

10. The information handling system of claim 8, the motion sensor further to measure a time domain waveform of detected movement of the information handling system, and to perform a Fast Fourier Transform conversion of the time domain waveform to verify that a movement is the double tap movement.

11. The information handling system of claim 7, wherein if the embedded controller is powered off, the embedded controller wakes up in response to the relative state of charge request being received.

* * * * *